United States Patent
Jeong et al.

(10) Patent No.: US 6,741,138 B2
(45) Date of Patent: May 25, 2004

(54) MULTIPLE OUTPUT CRYSTAL OSCILLATOR

(75) Inventors: Chan Yong Jeong, Seoul (KR); Jae Il You, Kyungki-do (KR)

(73) Assignee: Samsung-Electro-Mechanics Co., Ltd., Kyungki-do (KR)

( * ) Notice: Subject to any disclaimer, the term of this patent is extended or adjusted under 35 U.S.C. 154(b) by 37 days.

(21) Appl. No.: 10/251,809

(22) Filed: Sep. 23, 2002

(65) Prior Publication Data
US 2003/0234697 A1 Dec. 25, 2003

(30) Foreign Application Priority Data
Jun. 21, 2002 (KR) .......................... 2002-34746

(51) Int. Cl.[7] .................................. H03B 5/36
(52) U.S. Cl. ..................... 331/158; 331/61; 331/74; 331/116 FE; 331/108 D
(58) Field of Search .................. 331/60.61, 74–77, 331/116 R, 116 FE, 158, 108 D; 310/318, 319

(56) References Cited

U.S. PATENT DOCUMENTS 3,979,693 A * 9/1976 Saari ........................... 331/61
4,302,731 A 11/1981 Ashida
4,951,007 A 8/1990 Kosinski

* cited by examiner

*Primary Examiner*—David Mis
(74) *Attorney, Agent, or Firm*—Lowe Hauptman Gilman & Berner LLP

(57) ABSTRACT

The present invention relates to a multiple output crystal oscillator having a plurality of output terminals for implementing multiple output and Integrated Circuit (IC) chips. More particularly, the crystal oscillator comprises a crystal resonator, a first IC chip having an oscillating circuit block and a frequency-adjusting circuit block, a second IC chip having an output-adjusting block, and a substrate structure for mounting said first and second IC chips, wherein said output terminals include a basic output terminal for outputting the oscillating signal from said first IC chip and at least one additional output terminal for outputting at least one wave form-adjusted oscillation signal from said second IC chip. In the present invention, said basic output terminal is placed on one of four underside corners of said substrate, and said additional output terminal is placed on the portion of the underside except the corners.

12 Claims, 8 Drawing Sheets

MULTIPLE OUTPUT CRYSTAL OSCILLATOR

BACKGROUND OF THE INVENTION

1. Field of the Invention

The present invention relates to a crystal oscillator having a plurality of output blocks for implementing multiple output. More particularly, the crystal oscillator using an Integrated Circuit (IC) chip comprises an additional output terminal on the underside thereof, in which an additional IC chip having an output-adjusting block connected to the additional output terminal is mounted on the crystal oscillator or an output-adjusting block added to the IC chip is connected to the additional output terminal.

2. Description of the Related Art

As well known in the art, crystal oscillator circuits using crystal have a number of advantages in actual application since crystals show high frequency stability and stable temperature characteristic as well as excellent processability. These advantages result in a current popularity of crystal oscillators each of which is constructed into a single package by incorporating a crystal into an oscillator circuit and which are capable of generating a preferred clock frequency by applying rated voltage only. In the telecommunication field, a crystal oscillator necessarily has an adjustable frequency in a specific range in order to maintain synchronization among a number of signals or to synchronize a system clock with a transmitting carrier wave. In order to synchronize the oscillation frequency of the crystal oscillator, an adjustable-capacitance device is generally used as a load capacitor in respect to the crystal. The adjustable-capacitance device adopts, for example, a varicap with a capacitance which is adjustable according to applied DC voltage. The crystal oscillator having the above functions is referred to as Voltage Controlled Crystall Oscillator (VCXO). An example of the VCXO is disclosed in U.S. Pat. No. 4,302,731.

As shown in FIG. 1, a crystal oscillator adjusts the frequency of a signal with an Automatic Frequency Controlling (AFC) block and a frequency-adjusting block and resonates the frequency into a specific frequency with a crystal resonator. The crystal oscillator further comprises an oscillating block for oscillating the frequency resonated by the crystal resonator and a component for outputting the oscillated frequency.

A crystal oscillator having a temperature-compensating circuit is also widely used to provide a uniform reference frequency regardless of surrounding temperature variation. This type of crystal oscillator is referred to as Temperature Compensated Crystal Oscillator (TCXO), an example of which is shown in U.S. Pat. No. 4,951,007. A Voltage Controlled Temperature Compensated Crystal Oscillator (VC-TCXO) is frequently used, in which a voltage controlling function is added for more precise frequency adjustment. Such a TCXO, as shown in FIG. 2, additionally comprises a temperature-compensating block in the structure of FIG. 1.

In using frequency signals outputted from the above crystal oscillators, the frequency signals are used as they are. Alternatively they may be amplified or converted into desired signals. As set products related to mobile communication such as mobile phones are recently diversified in their functions, each set product requires a signal having a waveform different from that of the original signal oscillated from the crystal oscillator, e.g. a signal of high amplitude. For the purpose of obtaining the high amplitude signal, a set product is mounted with a crystal oscillator and then, separately, a component for amplifying the amplitude of the original signal from the crystal oscillator. The above added component occupies a certain space in the set product, resultantly creating drawbacks that downsizing of the set product is obstructed while the design thereof is complicated. In this regard, incorporating a portion of a circuit set using a crystal oscillator into the crystal oscillator may further downsize the set product.

According to the structures of typical crystal oscillators of the prior art, however, the component on the set product cannot be incorporated therein. In a conventional crystal oscillator 100, as shown in FIG. 3, a chip 105 is mounted in a cavity provided above a substrate 103, and then a crystal oscillator unit 109 having the same size as that of the substrate 103 is mounted on the substrate 103 and connected electrically through terminal pads 107. A crystal resonator is usually contained inside the crystal oscillator unit 109. The oscillator is further provided with a voltage controlling terminal 111, a ground terminal 112, and output terminal 113 and an input terminal 114 on the underside of the substrate 103. Such an oscillator structure has a single output terminal, and the outputted signal from the single output terminal is to be adjusted through additional component on the set product (not shown) to produce amplified signal.

It is accordingly required to develop a crystal oscillator with a multiple output function wherein a component on a set product for amplifying the output signal is incorporated or wherein the circuit for multiple output function is added to the conventional IC.

SUMMARY OF THE INVENTION

The present invention has been made to solve the above problems and it is therefore an object of the present invention to impart a multiple output function to a crystal oscillator by providing a conventional single output crystal oscillator with a circuit for enabling multiple output and a number of output terminals.

Further it is another object of the invention to provide a multiple output function so that necessary output can be selectively used as well as reduces external components on the set product, thereby to enable the downsizing and multiple functioning of the product.

According to an aspect of the invention, to accomplish the above objects, it is provided a multiple output crystal oscillator comprising a crystal resonator; a first IC chip having an oscillating circuit block for oscillating a resonance signal from the crystal resonator and a frequency-adjusting circuit block; a second IC chip having an output-adjusting block for adjusting the oscillation signal from said oscillating circuit block of the first IC chip into at least one different waveform and then outputting those adjusted signals; and a substrate structure for mounting the first and second IC chips and having output terminals on the underside, wherein the output terminals of the substrate include a basic output terminal for outputting the oscillation signal from the first IC chip and at least one additional output terminal for outputting at least one waveform-adjusted oscillation signal from the second IC chip.

According to another aspect of the invention to obtain the above objects, it is provided a multiple output crystal oscillator comprising: a crystal resonator; an IC chip having an oscillating circuit block for oscillating a resonance signal from the crystal resonator, a frequency-adjusting circuit block and an output-adjusting block for adjusting the oscillation signal from said oscillating circuit block into at least one different waveform and then outputting those adjusted signals; and a substrate structure for mounting the IC chip and having output terminals on the underside, wherein said output terminals of the substrate include a basic output terminal for outputting the oscillation signal from said oscillating circuit block and at least one additional output terminal for outputting at least one waveform-adjusted oscillation signal from said output-adjusting block.

BRIEF DESCRIPTION OF THE DRAWINGS

The above and other objects, features and other advantages of the present invention will be more clearly understood from the following detailed description taken in conjunction with the accompanying drawings, in which:

FIG. 3 illustrates the crystal oscillator shown in FIG. 1, in which

FIG. 7 illustrates the first embodiment of the crystal oscillator shown in FIG. 4, in which

FIG. 8 illustrates the second embodiment of the crystal oscillator shown in FIG. 4, in which

FIG. 9 illustrates the third embodiment of the crystal oscillator shown in FIG. 4, in which

DETAILED DESCRIPTION OF THE PREFERRED EMBODIMENT

The following detailed description will discuss the present invention in reference to the accompanying drawings.

Figure 4:
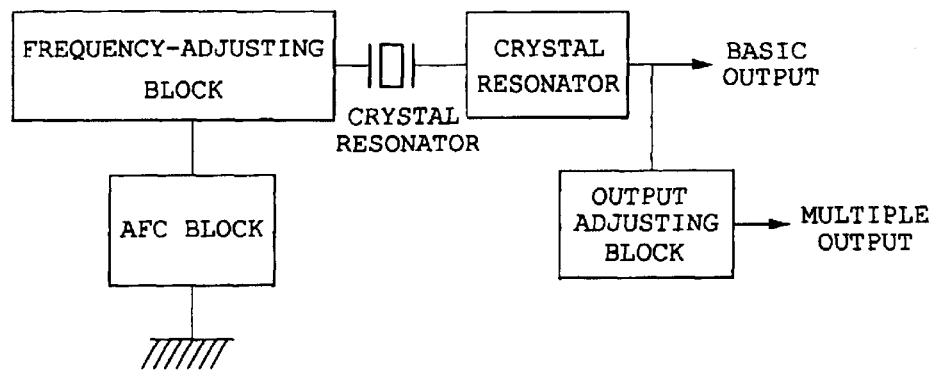
FIG. 4 is a block diagram of a multiple output VCCO of the invention.
Figure 5:
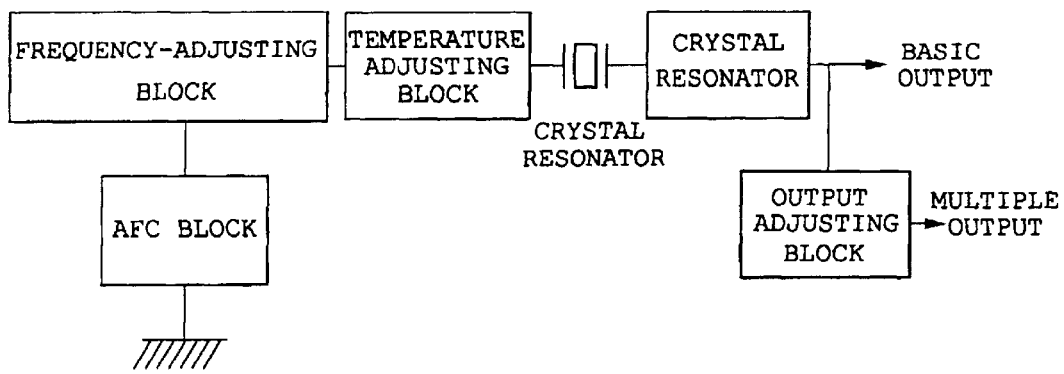
FIG. 5 is a block diagram of a multiple output VC-TCXO of the invention.
Figure 6:
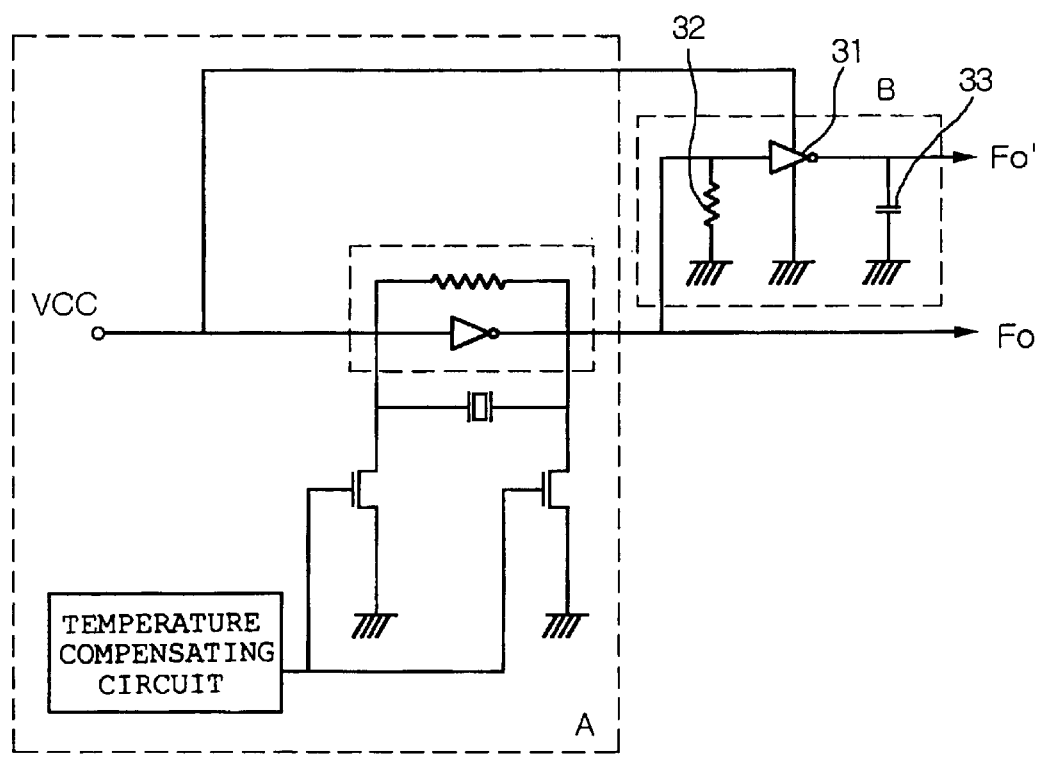
FIG. 6 is a circuit diagram of a crystal oscillator for performing multiple output of the invention.

FIG. 4 is a block diagram of a multiple output VCXO of the present invention, FIG. 5 is a block diagram of a multiple output VC-TCXO of the present invention, FIG. 6 is a circuit diagram of a crystal oscillator for performing multiple output of the present invention.

Figure 1:
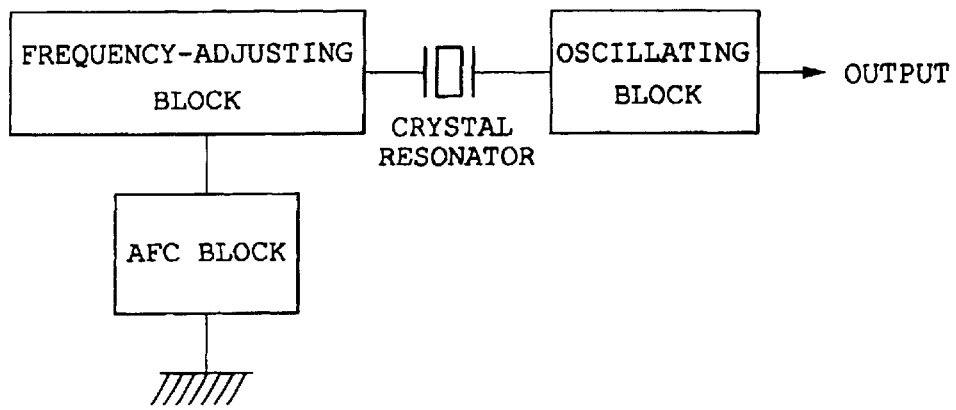
FIG. 1 is a block diagram of a conventional VCXO.
Figure 2:
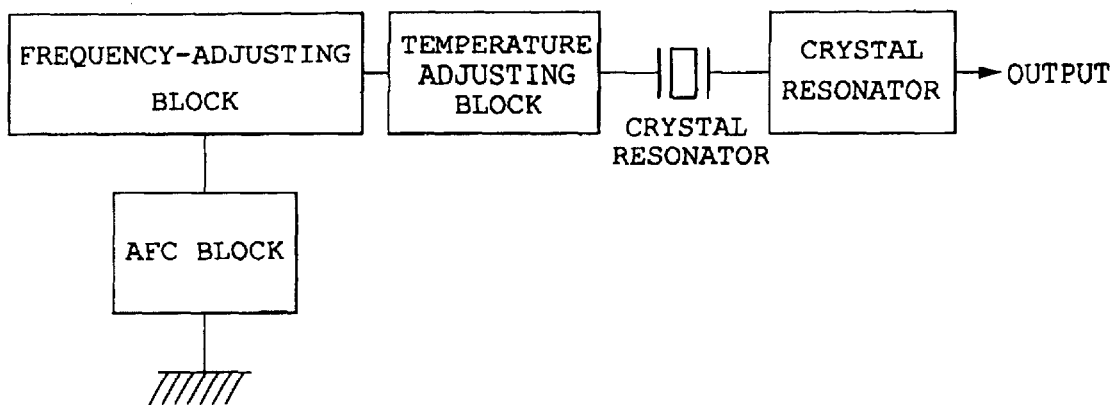
FIG. 2 is a block diagram of a conventional VC-TCXO.
Figure 3A:
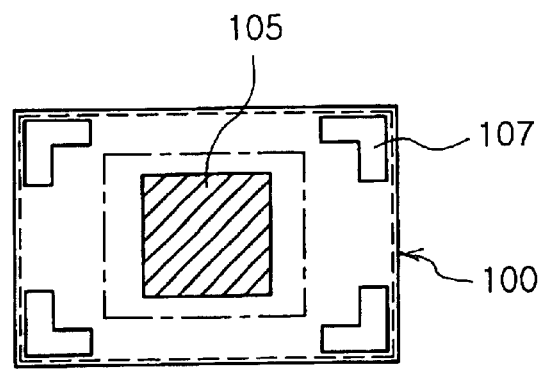
FIG. 3(a) is a plan view thereof.
Figure 3B:
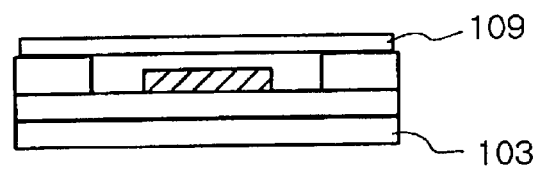
FIG. 3(b) is a side elevation view thereof.
Figure 3C:
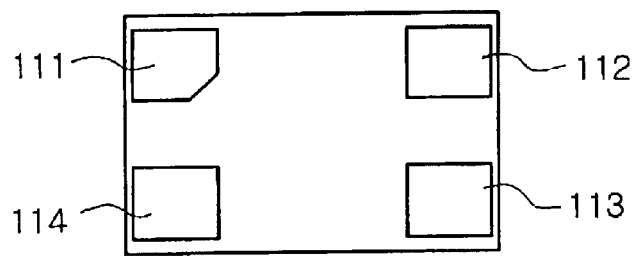
FIG. 3(c) is a bottom view thereof.

As shown in FIG. 4, the crystal oscillator of the invention comprises a frequency-adjusting block, a crystal resonator and an oscillating block as in the prior art of FIG. 2. With the invention, however, an output-adjusting block is additionally connected to the next of the oscillating block in order to realize multiple outputs. This additional circuit serves to adjust the amplitude of an oscillation signal from the oscillating block into a different amplitude, and can be realized into various circuits.

FIG. 6 shows an example of such an output-adjusting block circuit B for serving to adjust the waveform of an oscillation signal from a basic circuit A and then output the adjusted signal to an additional output terminal Fo'. The circuit of the output-adjusting block is a typical circuit of an inverter, and generally includes a diode 31, a resistance 32 provided between the input terminal of the diode 31 and a ground terminal and a capacitor 33 provided between an output terminal of the diode and another ground terminal. The circuit B of the output-adjusting block serves to receive the oscillation signal from the basic circuit A to amplify the amplitude thereof. The circuit B also functions to convert the basic oscillation signal having a waveform, i.e. a sinusoidal wave, into a CMOS signal. Advantageously, the amplified signal like this is detected more easily than the unamplified signal.

FIG. 5 shows a temperature compensated crystal oscillator realizing multiple outputs by inserting a temperature-compensating block between a frequency-adjusting block and a crystal resonator and by adding an output-adjusting circuit block to the next of an oscillating block as in FIG. 4.

Figure 7A:
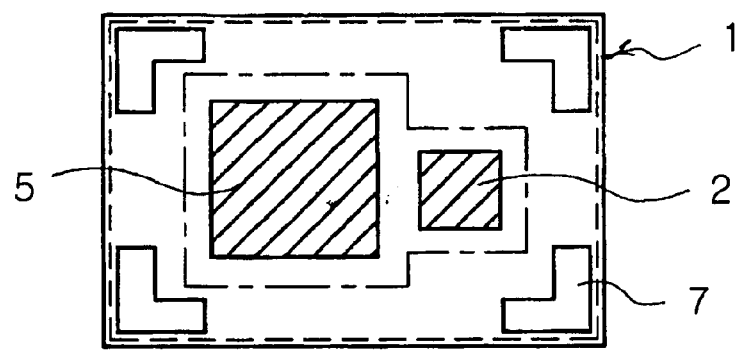
FIG. 7(a) is a plan view thereof.
Figure 7B:
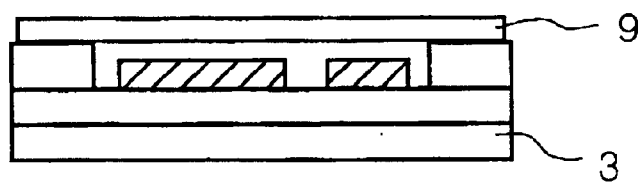
FIG. 7(b) is a side elevation view thereof.
Figure 7C:
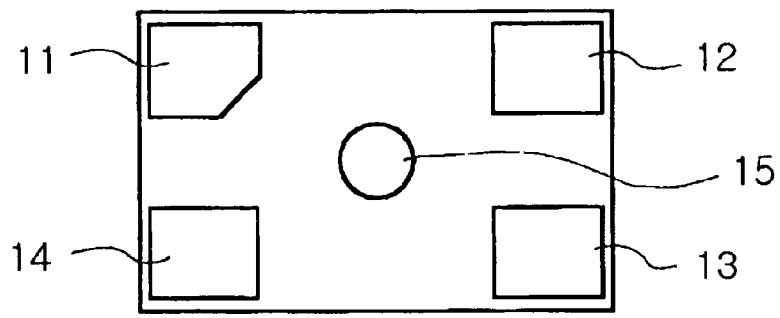
FIG. 7(c) is a bottom view thereof.

FIG. 7 illustrates the first embodiment of the crystal oscillator shown in FIG. 4, in which FIG. 7(a) is a plan view thereof, FIG. 7(b) is a side elevation view thereof, and FIG. 7(c) is a bottom view thereof.

As shown in FIG. 7, an IC chip to which a number of components of a crystal oscillator are integrated for performing multiple outputs can be respectively used as the first IC chip 5 and the second IC chip 2. The first IC chip 5 utilizes an IC chip used for a conventional crystal oscillator, and the second IC chip 2 comprises the output-adjusting block which outputs the oscillation signal by adjusting the same into a different oscillation frequency. The second IC chip 2 is adapted to output at least one signal, and the first and second IC chips are mounted on an upper plane of the substrate 3.

In this embodiment, the crystal oscillator comprises a cavity in the upper plane of the substrate 3 on which the first and second IC chips are mounted, terminal pads 7 attached to upper faces of walls defining the cavity and a crystal oscillating unit 9 connected via the terminal pads 7 to the chips. Also, the terminals are provided on the underside of the substrate 3, which are electrically connected to the chips and directly connected to boards of set products. The terminals comprise a voltage controlling terminal 11, a ground terminal 12, a basic output terminal 13 and an input terminal 14 each provided on an underside corner of the substrate 3. The basic output terminal 13 is connected to the first IC chip 5 to output a signal therefrom to set product. Also in this embodiment, an additional output terminal 15 is provided on a central portion of the underside of the substrate, which is connected to the second IC chip 2 to output at least one second adjusted signal.

Figure 10A:
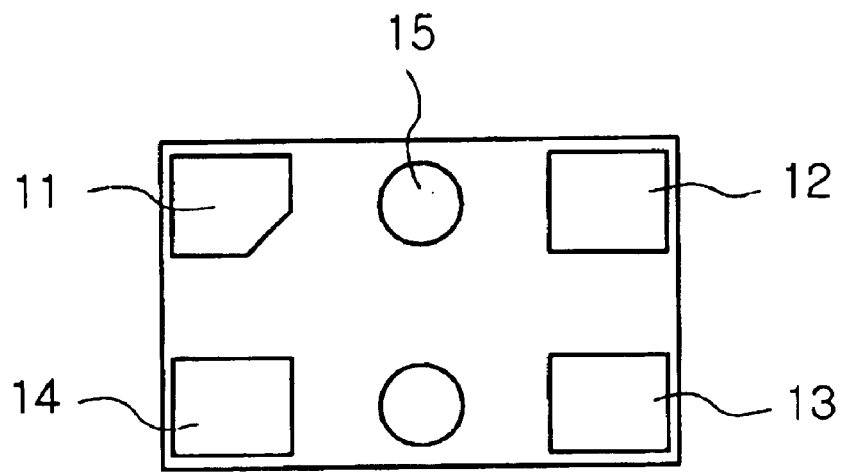
FIG. 10 shows several exemplary arrays of blocks in the underside of the crystal oscillator of the invention.

Although preferably provided on the central portion of the underside in the substrate as above, the additional output terminal 15 is not restricted thereto and can be positioned on any of four corners of the underside in the substrate or on a portion of the underside other than the corners. Also, the additional output terminal 15 is not restricted in its number, but the invention can provide two output terminals, as shown in FIG. 10(a), or more. As shown in FIG. 10(a), two additional output terminals 15 are provided on the underside as opposite to each other.

Figure 8A:
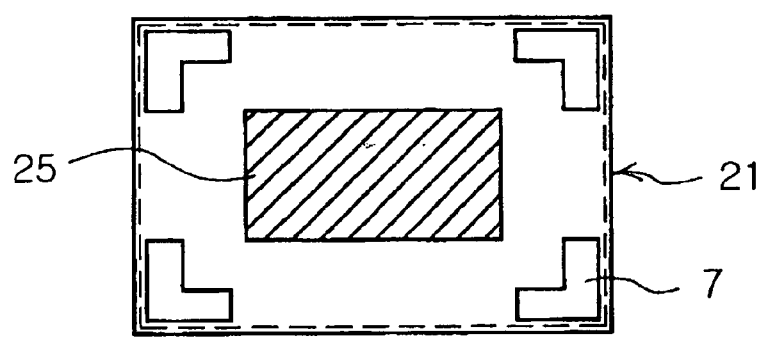
FIG. 8(a) is a plan view thereof.
Figure 8B:
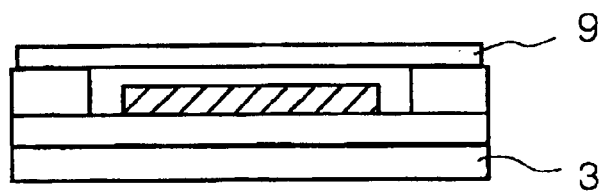
FIG. 8(b) is a side elevation view thereof.
Figure 8C:
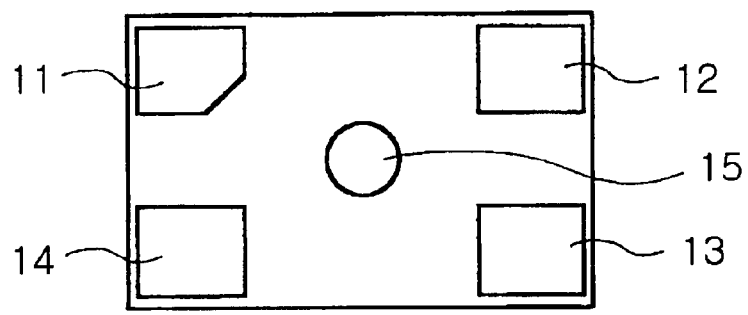
FIG. 8(c) is a bottom view thereof.

FIG. 8 illustrates the second embodiment of the crystal oscillator shown in FIG. 4, in which FIG. 8(a) is a plan view thereof, FIG. 8(b) is a side elevation view thereof, and FIG. 8(c) is a bottom view thereof.

As shown in FIG. 8, the crystal oscillator can comprise a single IC chip 25 to which several component circuits of the crystal oscillator are integrated for performing the multiple outputs. The IC chip 25 includes various functions such as frequency adjustment, oscillation and multiple outputs in one chip. The IC chip 25 is connected to a crystal resonator and then mounted on the substrate to be electrically connected to a number of terminals on the underside of the substrate.

In this embodiment also as in the first embodiment, the crystal oscillator comprises a cavity provided on the upper plane of the substrate 3 for mounting the IC chip 25, terminal pads 7 attached to upper faces of walls defining the cavity and a crystal oscillating unit 9 connected via the terminal pads 7 to the chip. Further, the crystal oscillator is provided on the underside of the substrate 3 with terminals which are electrically connected to the chips and directly connected to boards of set products. The entire terminals have the same constructions as in the first embodiment.

Figure 9A:
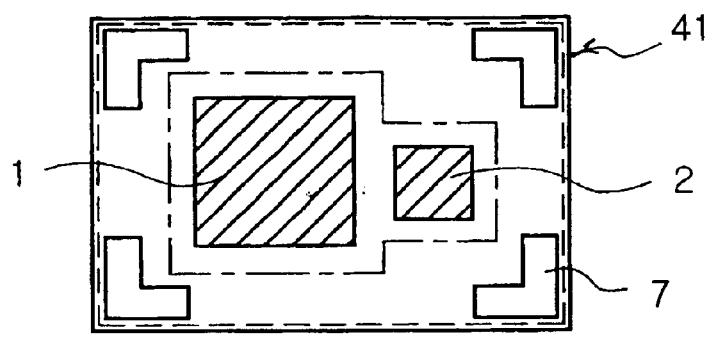
FIG. 9(a) is a plan view thereof.
Figure 9B:
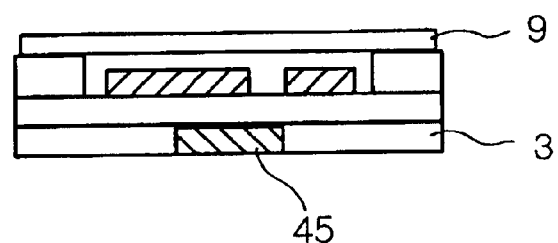
FIG. 9(b) is a side elevation view thereof.
Figure 9C:
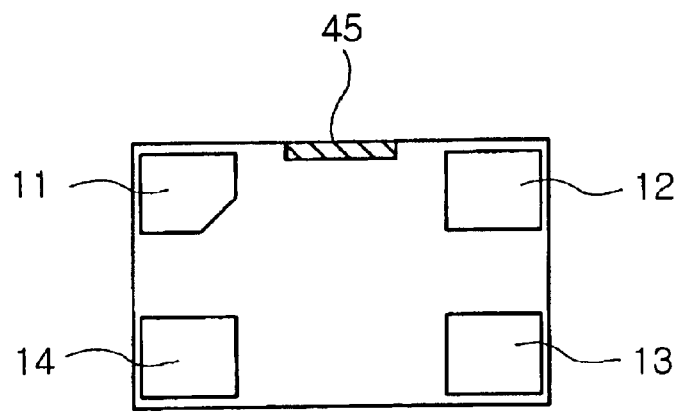
FIG. 9(c) is a bottom view thereof.

FIG. 9 illustrates another example of the additional output terminal. FIG. 9(a) is a plan view thereof, FIG. 9(b) is a side elevation view thereof, and FIG. 9(c) is a bottom view thereof.

Figure 10B:
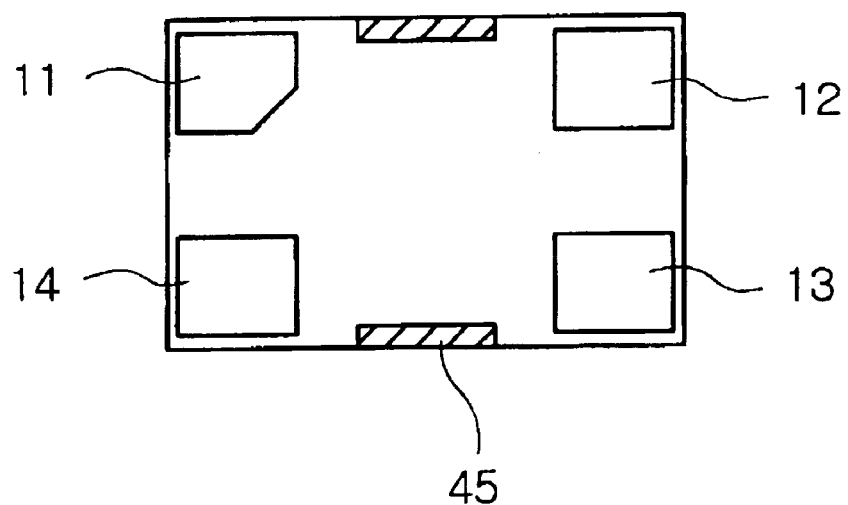

This example is illustrated by utilizing two IC chips including the first IC chip 1 and the second IC chip 2 like the first embodiment of FIG. 7(a). This example is discriminated from the additional output terminals of FIG. 7(c) and FIG. 10(a), respectively, in that the terminal is provided in a lateral portion of the substrate extending to bottom of the lower substrate. The first IC chip is connected to one of the terminals 11 to 14 on the underside of the substrate 3 through via-holes and the second IC chip is connected to an additional output terminal 45 provided in a lower lateral portion of the substrate for outputting the adjusted signal. The additional output terminal 45 provided in the lower lateral portion of the substrate serves to increase the flexibility in designing the circuit block of set product which will be connected to the second output terminal when the crystal oscillator is mounted on the set product (not shown). This construction also allows the additional output terminal 45 to be designed at the largest distance from the basic output terminal 13 so as to avoid any abnormal output which may occur owing to the interference between the basic signal and the amplified signal. Also this construction having the lateral terminal 45 can be further provided with at least one lateral terminal which can be connected via a circuit pattern in the substrate or wire. FIG. 10(b) shows that two lateral terminals 45 are provided, in which the lateral terminals can be provided in plurality according to the number of outputs.

According to the first to third embodiments, the crystal oscillator can function as the TCXO by further comprising the temperature-compensating circuit therein. This is realized by further providing the temperature-compensating circuit to the IC chip which is mounted on the substrate.

According to the invention as set forth above, the conventional single output crystal oscillator can perform multiple output by further comprising the additional circuit for enabling multiple output and a plurality of output terminals.

Further, the multiple output function is provided to selectively output the necessary waveform and the external components are reduced in respect to a conventional set product thereby to realize the downsizing and multiple functioning of set product of the invention.

Moreover, according to the present invention, the output terminal for multiple output can be provided in the lateral portion so as to increase the flexibility in designing the circuit block of set product connected to the additional output terminal when the crystal oscillator is mounted on a set product as well as to avoid any abnormal output which may occur owing to the interference between the basic signal and the amplified signal.

Although the invention has been shown and described with reference to the certain preferred embodiment thereof, it will be understood by those skilled in the art that various modifications and changes in form and details may be made without departing from the spirit and scope of the invention as defined by the appended claims.

What is claimed is:

1. A multiple output crystal oscillator comprising:
    a crystal resonator;
    a first IC chip having an oscillating circuit block for oscillating a resonance signal from said crystal resonator and a frequency-adjusting circuit block;
    a second IC chip having an output-adjusting block for adjusting the oscillation signal from said oscillating circuit block of the first IC chip into at least one different waveform and then outputting those adjusted signals; and
    a substrate structure for mounting said first and second IC chips and having output terminals on the underside,
    wherein said terminals of the substrate include a basic output terminal for outputting the oscillation signal from said first IC chip and at least one additional output terminal for outputting at least one waveform-adjusted oscillation signal from said second IC chip.

2. The multiple output crystal oscillator according to claim 1, wherein one of said basic and additional output terminals is placed on one of four underside corners of said substrate, and the other one of said basic and additional output terminals is placed on the portion of the underside except the corners.

3. The multiple output crystal oscillator according to claim 2, wherein said basic output terminal is placed on one of four underside corners of said substrate, and said additional output terminal is placed on the portion of the underside except the corners.

4. The multiple output crystal oscillator according to claim 1, wherein said additional output terminal is provided on a lateral portion of said substrate, extending to the bottom of the lower substrate.

5. The multiple output crystal oscillator according to claim 1, wherein said output-adjusting block of the second IC chip includes:
    a diode for amplifying the oscillation, signal from said first IC chip;
    a resistance provided between an input terminal of said diode and a ground terminal; and
    a capacitor provided between an output terminal of said diode and the ground terminal.

6. The multiple output crystal oscillator according to claim 1, wherein said first IC chip further has a temperature-compensating circuit block.

7. A multiple output crystal oscillator comprising:
    a crystal resonator;
    an IC chip having an oscillating circuit block for oscillating a resonance signal from said crystal resonator, a frequency-adjusting circuit block and an output-adjusting block for adjusting the oscillation signal from said oscillating circuit block into at least one different waveform and then outputting those adjusted signals; and
    a substrate structure for mounting said IC chips and having output terminals on the underside,
    wherein said output terminals of the substrate include a basic output terminal for outputting the oscillation signal from said oscillating circuit block and at least one additional output terminal for outputting at least one waveform-adjusted oscillation signal from said output-adjusting block.

8. The multiple output crystal oscillator according to claim 7, wherein one of said basic and additional output terminals is placed on one of four underside corners of said substrate, and the other one of said basic and additional output terminals is placed on the portion of the underside except the corners.

9. The multiple output crystal oscillator according to claim 8, wherein said basic output terminal is placed on one of four underside corners of said substrate, and said additional output terminal is placed on the portion of the underside except the corners.

10. The multiple output crystal oscillator according to claim 7 wherein said additional output terminal is provided on a lateral portion of said substrate, extending to the bottom of the lower substrate.

11. The multiple output crystal oscillator according to claim 7, wherein said output-adjusting block of the IC chip includes:
   a diode for amplifying the oscillation signal from said first IC chip;
   a resistance provided between an input terminal of said diode and a ground terminal; and
   a capacitor provided between an output terminal of said diode and the ground terminal.

12. The multiple output crystal oscillator according to claim 7, wherein said IC chip further has a temperature-compensating circuit block.

* * * * *